(12) United States Patent
Teranishi et al.

(10) Patent No.: US 10,598,695 B2
(45) Date of Patent: Mar. 24, 2020

(54) SOCKET

(71) Applicant: OMRON Corporation, Kyoto-shi, Kyoto (JP)

(72) Inventors: Hirotada Teranishi, Osaka (JP); Takahiro Sakai, Moriyama (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 15/751,174

(22) PCT Filed: Mar. 14, 2017

(86) PCT No.: PCT/JP2017/010195
§ 371 (c)(1),
(2) Date: Feb. 8, 2018

(87) PCT Pub. No.: WO2017/217043
PCT Pub. Date: Dec. 21, 2017

(65) Prior Publication Data
US 2019/0128922 A1    May 2, 2019

(30) Foreign Application Priority Data

Jun. 17, 2016   (JP) .................................. 2016-121156

(51) Int. Cl.
*G01R 1/067*         (2006.01)
*G01R 1/04*          (2006.01)
(Continued)

(52) U.S. Cl.
CPC ....... *G01R 1/06738* (2013.01); *G01R 1/0408* (2013.01); *G01R 1/067* (2013.01);
(Continued)

(58) Field of Classification Search
CPC ... G01R 1/00; G01R 1/02; G01R 1/04; G01R 1/0408; G01R 1/043; G01R 1/0433;
(Continued)

(56) References Cited

U.S. PATENT DOCUMENTS 3,685,865 A * 8/1972 Young .................... F16B 7/00
403/316
5,113,555 A * 5/1992 Wilson ................... B23Q 16/08
24/584.1
(Continued)

FOREIGN PATENT DOCUMENTS

CN   101334425 A   12/2008
JP   H07-254468 A  10/1995
(Continued)

OTHER PUBLICATIONS

English translation of the International Search Report of PCT/JP2017/010195 dated May 30, 2017.
(Continued)

*Primary Examiner* — Hoai-An D. Nguyen
(74) *Attorney, Agent, or Firm* — Metrolex IP Law Group, PLLC

(57) ABSTRACT

A socket includes a first housing and a second housing each including a housing recessed portion capable of housing and holding a contact provided at its first end with a first contact portion and at its second end with a second contact portion while the first and second contact portions each are exposed, and a positioning member which positions the first and second housings independently of each other such that the housing recessed portion of the first housing and the housing recessed portion of the second of housing are disposed adjacent to each other to be paired.

10 Claims, 12 Drawing Sheets

(51) Int. Cl.
*G01R 1/073* (2006.01)
*G01R 31/26* (2014.01)
*G01R 31/18* (2006.01)
*G01R 31/28* (2006.01)

(52) U.S. Cl.
CPC ......... *G01R 1/073* (2013.01); *G01R 1/07314* (2013.01); *G01R 31/26* (2013.01); *G01R 31/2886* (2013.01)

(58) Field of Classification Search
CPC ........ G01R 1/045; G01R 1/0483; G01R 1/06; G01R 1/067; G01R 1/06711; G01R 1/06733; G01R 1/06738; G01R 1/073; G01R 1/07307; G01R 1/07314; G01R 31/00; G01R 31/26; G01R 31/28; G01R 31/2851; G01R 31/2863; G01R 31/0886; G01R 31/2886
USPC ....... 324/500, 537, 755.01, 756.02; 439/252, 439/257, 268, 269.2, 280, 356, 375, 597, 439/602, 605, 607.14, 607.16, 607.26, 439/607.38, 607.59, 620.02, 620.11, 439/620.15, 620.17, 620.18, 620.2, 439/620.23, 620.25, 823, 842, 850, 851, 439/854, 855, 867
See application file for complete search history.

(56) References Cited

U.S. PATENT DOCUMENTS

| | | | | |
|---|---|---|---|---|
| 6,448,803 | B1* | 9/2002 | Chung | G01R 1/0408 324/756.02 |
| 6,676,321 | B2* | 1/2004 | Gueret | A45D 33/00 401/126 |
| 6,881,100 | B2* | 4/2005 | Barry | H01R 13/514 439/701 |
| 2007/0072479 | A1 | 3/2007 | Osato et al. | |
| 2011/0031991 | A1 | 2/2011 | Lee et al. | |
| 2011/0227594 | A1 | 9/2011 | Suzuki et al. | |

FOREIGN PATENT DOCUMENTS

| | | |
|---|---|---|
| JP | 3062558 U | 7/1999 |
| JP | 2010-008388 A | 1/2010 |
| JP | 2011-196844 A | 10/2011 |
| WO | 2006003722 A1 | 1/2006 |

OTHER PUBLICATIONS

English translation of the Written Opinion of PCT/JP2017/010195 dated May 30, 2017.
The Chinese Office Action dated Nov. 25, 2019 in a counterpart Chinese patent application.

* cited by examiner

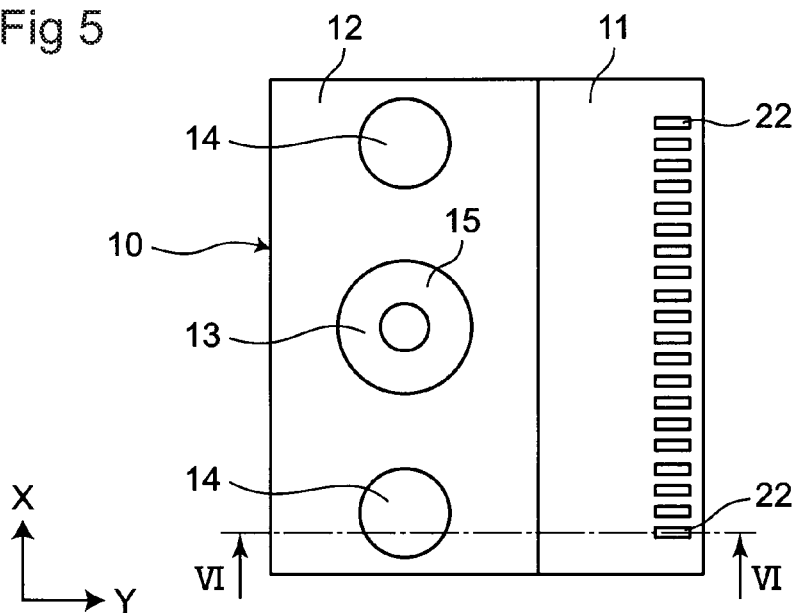
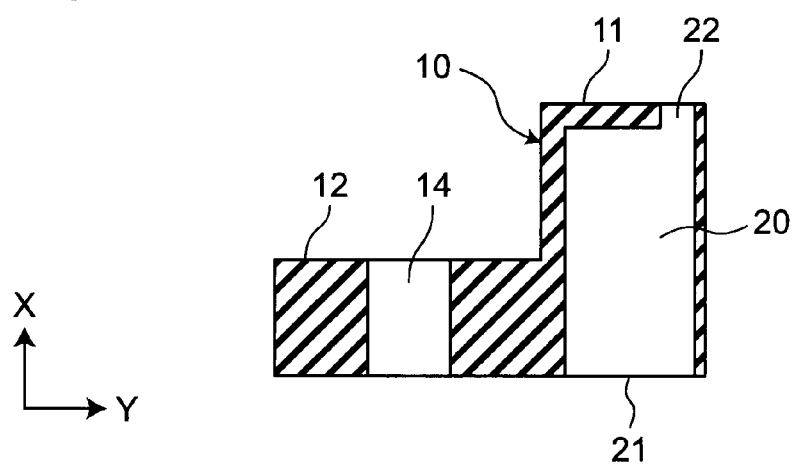

SOCKET

TECHNICAL FIELD

The present invention relates to a socket.

BACKGROUND ART

In an electronic component module such as a camera and a liquid crystal panel, a continuity inspection, an operating characteristic inspection, and the like are typically performed in its manufacturing process. These inspections each are performed by connecting an FPC contact electrode installed in the electronic component module to be connected to a main body substrate, or an electrode portion of a mounted board-to-board connector or the like, to an inspection device by using a probe pin.

This kind of socket for housing a contact is described in PTL 1, for example. The socket includes a plurality of pairs of slits that is disposed at equal intervals and each of which is capable of storing a contact.

CITATION LIST

Patent Literature

PTL 1: Japanese Unexamined Patent Publication No. 2011-196844

SUMMARY OF INVENTION

Technical Problem

Unfortunately, an interval between the paired slits is predetermined in the socket, so that when there is an error in processing of a terminal(s) of an inspection apparatus or an inspection object, for example, a contact(s) may not be accurately positioned to align with the terminal(s) of the inspection apparatus or the inspection object.

Thus, it is an object of the present invention to provide a socket capable of accurately positioning a contact.

Solution to Problem

A socket of an aspect of the present invention includes a first housing and a second housing each including a housing recessed portion capable of housing and holding a contact provided at its first end with a first contact portion and at its second end with a second contact portion while the first and second contact portions each are exposed, and a positioning member which positions the first and second housings independently of each other such that the housing recessed portion of the first housing and the housing recessed portion of the second housing are disposed adjacent to each other to be paired.

Advantageous Effects of Invention

According to the socket of the aspect, the paired housing recessed portions each capable of housing and holding a contact are separately disposed in each of the first and second housings and the first and second housings is positioned independently of each other by the positioning member, so that even when there is an error in processing of a terminal of an inspection apparatus or an inspection object, for example, a contact can be accurately positioned to align with the terminal of the inspection apparatus or the inspection object.

BRIEF DESCRIPTION OF DRAWINGS

FIG. 5 is a front view of the housing of the socket of FIG. 1.

FIG. 6 is a sectional view taken along line VI-VI of FIG. 5.

DESCRIPTION OF EMBODIMENTS

Hereinafter, an embodiment of the present invention will be described with reference to accompanying drawings. In the following description, terms (e.g., terms including "upper", "lower", "right", and "left") each indicating a specific direction or position are used as necessary, and these terms are used to facilitate understanding of the invention with reference to the drawings, and the technical scope of the present invention is not limited by the meaning of these terms. In addition, the following description is merely intrinsically exemplary, and is not intended to limit the invention, its application, or its use. Further, the drawings are schematic, and a ratio of each dimension and the like do not necessarily coincide with actual ones.

(First Embodiment)

Figure 1:
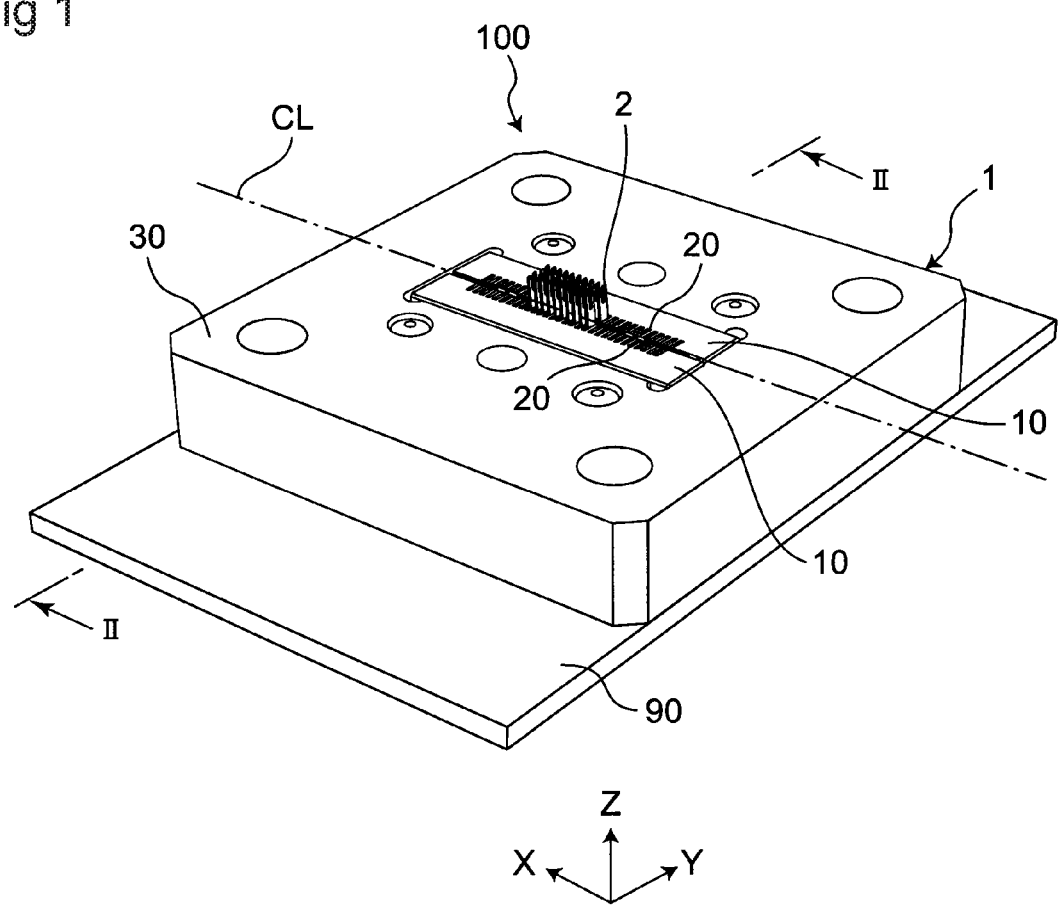
FIG. 1 is a perspective view illustrating a state where an inspection unit using a socket according to a first embodiment of the present invention is attached to an inspection apparatus or a substrate of an inspection object.

A socket 1 of a first embodiment of the present invention has insulation, and is attached to a substrate 90 of an inspection object or an inspection apparatus while housing and holding a probe pin 2 as an example of a contact, as illustrated in FIG. 1, for example. The socket 1 and the probe pin 2 constitute an inspection unit 100.

As illustrated in FIG. 1, the socket 1 includes a pair of insulating housings 10 and 10 (i.e., first housing 10 and second housing 10), and an insulating base housing 30 as an example of a positioning member.

Figure 2:
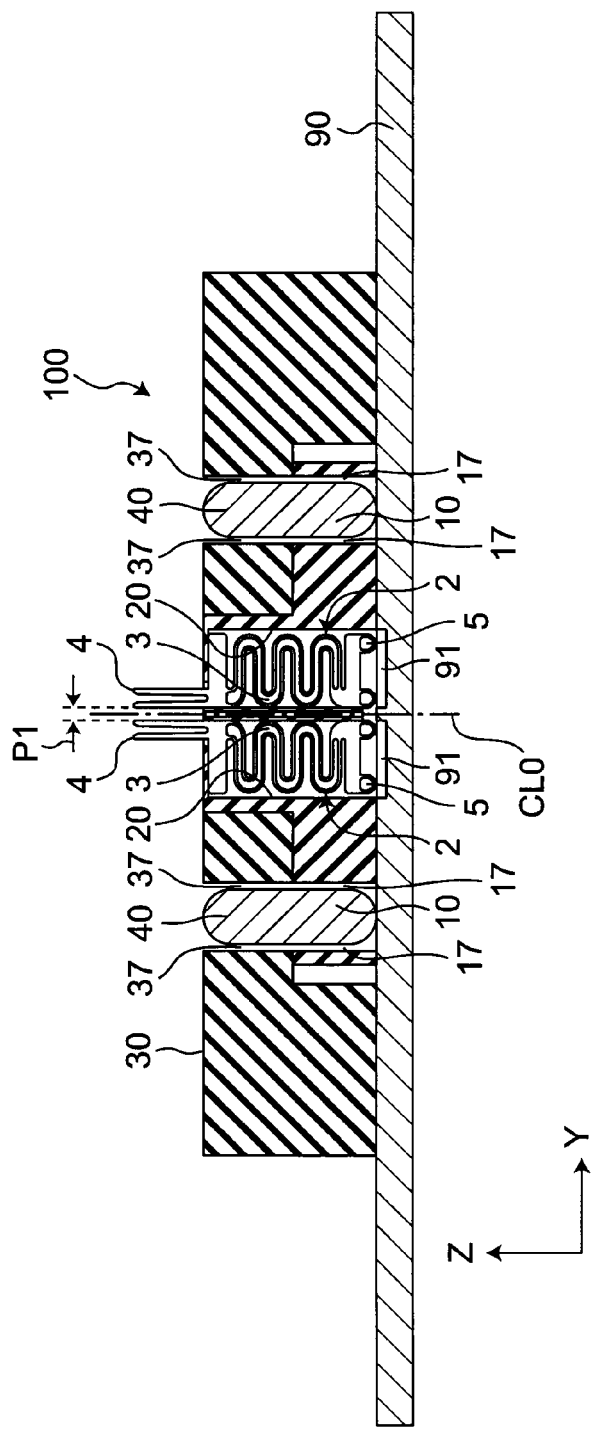
FIG. 2 is a sectional view taken along line II-II of FIG. 1.

As illustrated in FIG. 2, each housing 10 includes a housing recessed portion 20 capable of housing and holding the probe pin 2 while a first contact portion 4 and a second contact portion 5 provided at respective longitudinal ends of the probe pin 2 having conductivity in the shape of a thin plate are exposed, for example. The housing recessed portion 20 has an elongated rectangular planar shape, for example.

While a single housing recessed portion 20 may be provided in each housing 10, a plurality of housing recessed portions 20 may be disposed in a row so that array directions of the respective housing recessed portions 20 of the pair of housings 10 may be parallel to each other, for example. That is, as illustrated in FIG. 1, the pair of housings 10 and 10 is positioned by the base housing 30 such that the plurality of housing recessed portions 20 of each housing 10 is disposed adjacent to each other to be paired, and array directions of the plurality of housing recessed portions are parallel to each other.

As illustrated in FIG. 2, each probe pin 2 includes an elastic portion 3, a first contact portion 4 provided at one end of the elastic portion 3, a pair of second contact portions 5 provided at the other end of the elastic portion 3. The first contact portion 4 projects upward from one end in a width direction of an upper end of the elastic portion 3. The pair of second contact portions 5 projects downward from both ends in a width direction of a lower end of the elastic portion 3.

In the following description, an array direction of the adjacent housing recessed portions 20 in plan view is indicated as an X direction, and a direction orthogonal to the X direction is indicated as a Y direction. In addition, a height direction of the socket 1 orthogonal to the X and Y directions is indicated as a Z direction.

Figure 3:
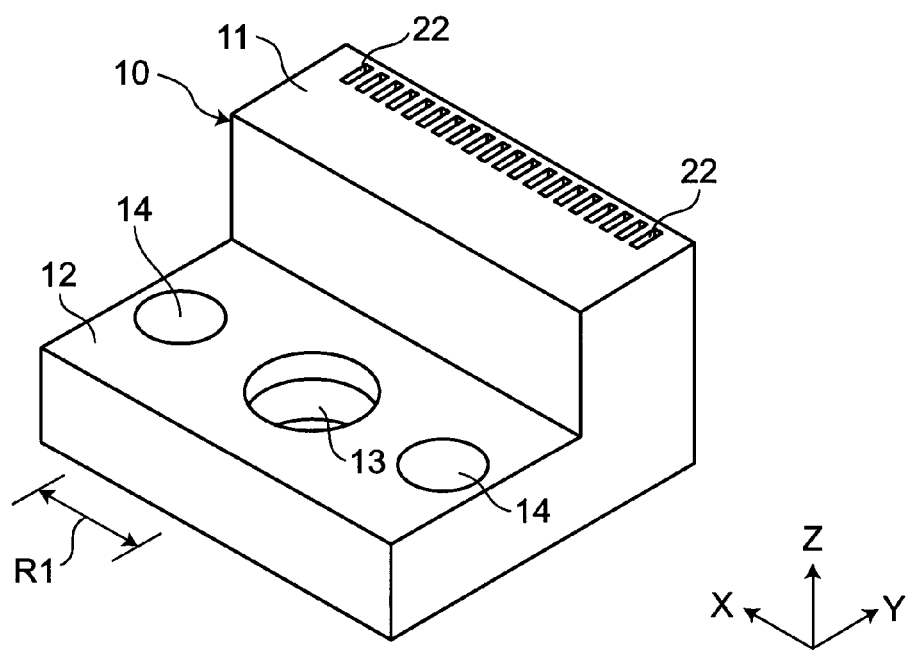
FIG. 3 is a perspective view of a housing of the socket of FIG. 1 as viewed from front.
Figure 4:
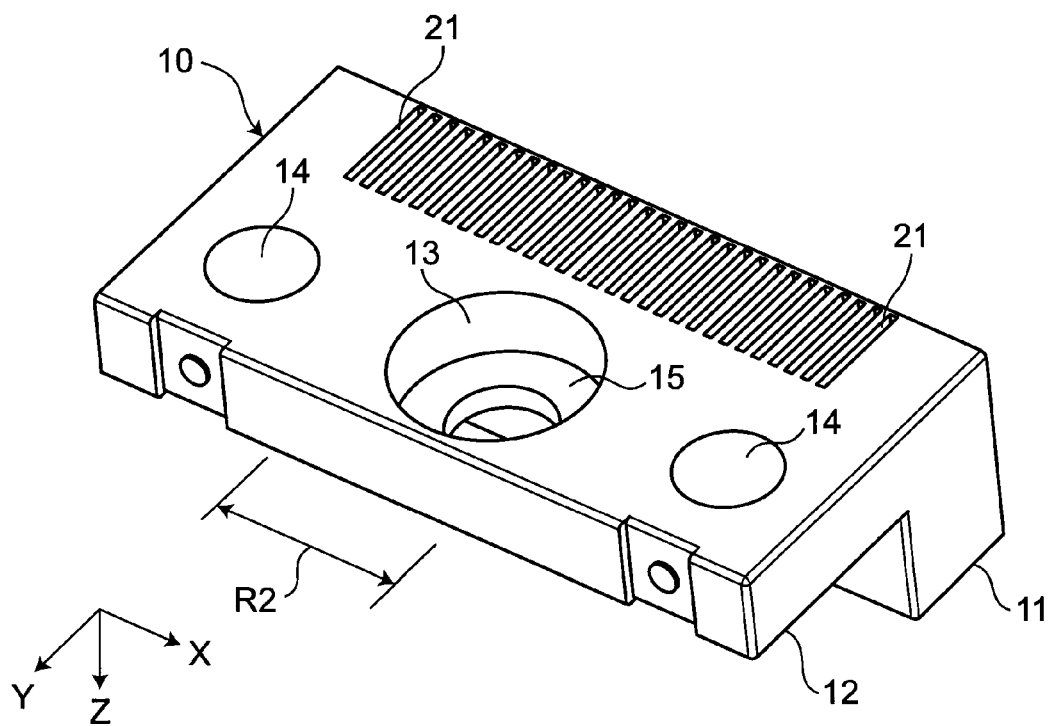
FIG. 4 is a perspective view of the housing of the socket of FIG. 1 as viewed from rear.

As illustrated in FIGS. 3 and 4, each housing 10 extends in a direction orthogonal to a row direction (X direction) of the housing recessed portions 20, and in FIG. 3, each housing 10 is formed stepwise to be lowered in a direction toward the left in the Y direction to include a high step portion 11 serving as a probe pin housing and holding portion, and a low step portion 12 serving as a positioning portion.

The high step portion 11 is provided with a plurality of housing recessed portions 20. As illustrated in FIGS. 3 to 6, the respective housing recessed portions 20 are disposed at intervals along the X direction so as to form a row. Each of the housing recessed portions 20 is provided on its lower side in the Z direction with an opening 21 that serves as a probe pin insertion opening of each of the housing recessed portions 20, and that is opened in a lower surface of the high step portion 11 in the Z direction. In addition, each of the housing recessed portions 20 is provided on its upper side in the Z direction with a slot 22 that passes through a bottom surface of each of the housing recessed portions 20, and that is opened in an upper surface of the high step portion 11 in the Z direction.

As illustrated in FIG. 2, the opening 21 of each housing recessed portion 20 is configured such that the probe pin 2 can be inserted into the housing recessed portion 20 from the outside of the housing recessed portion 20. When the probe pin 2 is housed in the housing recessed portion 20, each of the second contact portions 5 is exposed from the opening 21 to the outside of the housing 10.

The slots 22 of the respective housing recessed portions 20 allow the second contact portion 4 of the probe pin 2 to be inserted from the inside of the housing recessed portion 20. When the probe pin 2 is sequentially housed in the housing recessed portion 20 from the first contact portion 4 through the opening 21, the first contact portion 4 of the probe pin 2 is exposed to the outside of the housing 10 from the slot 22 through the housing recessed portion 20 to allow the elastic portion 3 to be supported on the bottom surface of the housing recessed portion 20.

That is, each of the housing recessed portions 20 can house and hold each probe pin 2 while the first contact portion 4 and the second contact portion 5 of the probe pin 2 are exposed to the outside of the housing 10.

As illustrated in FIG. 6, length of each housing recessed portion 20 in the Y direction is the same as length of the opening 21 in the Y direction, and length of the slot 22 in the Y direction is shorter than the length of each housing recessed portion 20 in the Y direction.

The low step portion 12 includes a holding hole 13 and a positioning hole 14 that are disposed at intervals along a row direction (X direction) of the housing recessed portion 20.

The holding hole 13 is provided at the center in the X direction of the low step portion 12. The holding hole 13 has a circular shape in plan view seen from the Z direction and passing through in the Z direction. The holding hole 13 is provided at its upper end in the Z direction with a flange portion 15, as illustrated in FIG. 4. The flange portion 15 causes a diameter R1 (illustrated in FIG. 3) of an opening at the upper end in the Z direction of the holding hole 13 to be smaller than a diameter R2 (illustrated in FIG. 4) of an opening at a lower end in the Z direction thereof. With such a size configuration, when a fastening member such as a screw is inserted into the holding hole 13 from a lower surface (surface illustrated in FIG. 4) of the housing 10 in the Z direction, it is possible to prevent a screw head projecting from a screw shaft portion of the fastening member from projecting from the holding hole 13 to the outside of the housing 10, for example.

The positioning holes 14 are provided on respective sides across the holding hole 13 in the X direction. Each positioning hole 14 has a circular shape having a diameter smaller than that of the holding hole 13 in plan view seen from the Z direction, and passes through in the Z direction.

The holding hole 13 and the pair of positioning holes 14 are disposed such that a straight line connecting the centers of the holding hole 13 and the pair of respective positioning holes 14 is substantially parallel to the row direction of the housing recessed portion 20, or the X direction.

Figure 7:
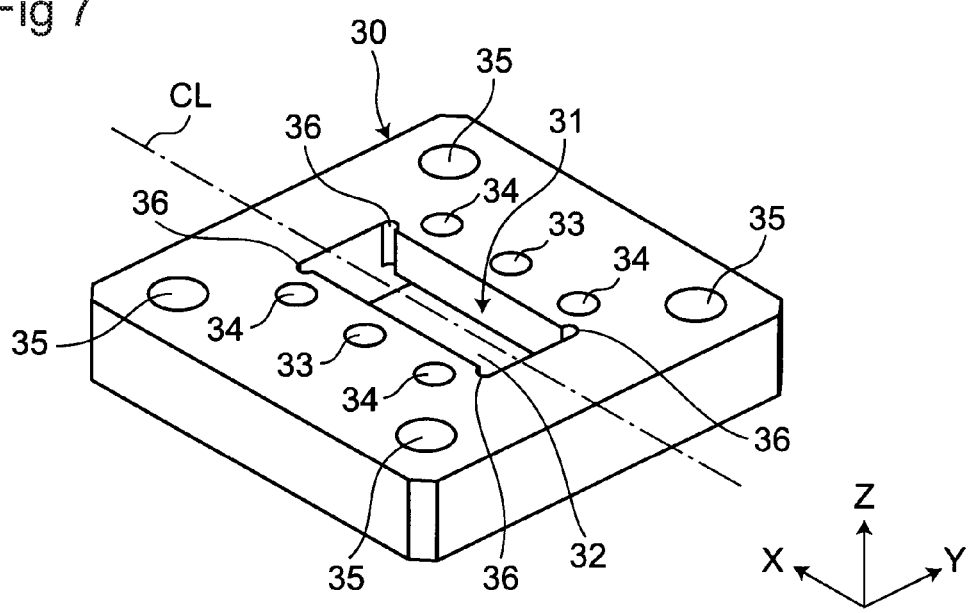
FIG. 7 is a perspective view of a base housing of the socket of FIG. 1 as viewed from front.
Figure 8:
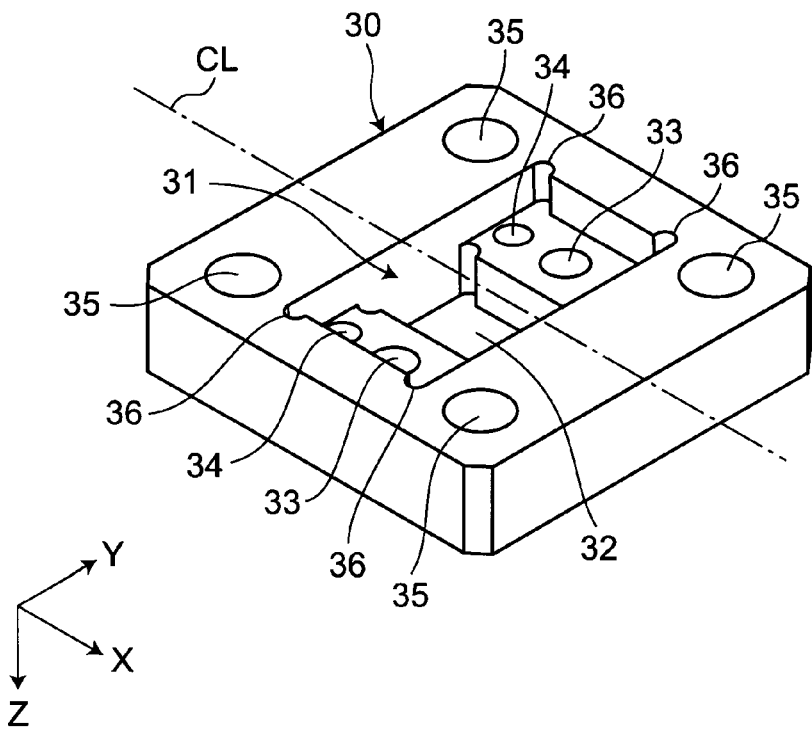
FIG. 8 is a perspective view of the base housing of the socket of FIG. 1 as viewed from rear.

As illustrated in FIGS. 7 and 8, the base housing 30 has a substantially rectangular plate shape that is symmetrical with respect to a centerline CL in the Y direction extending in the X direction.

Figure 9:
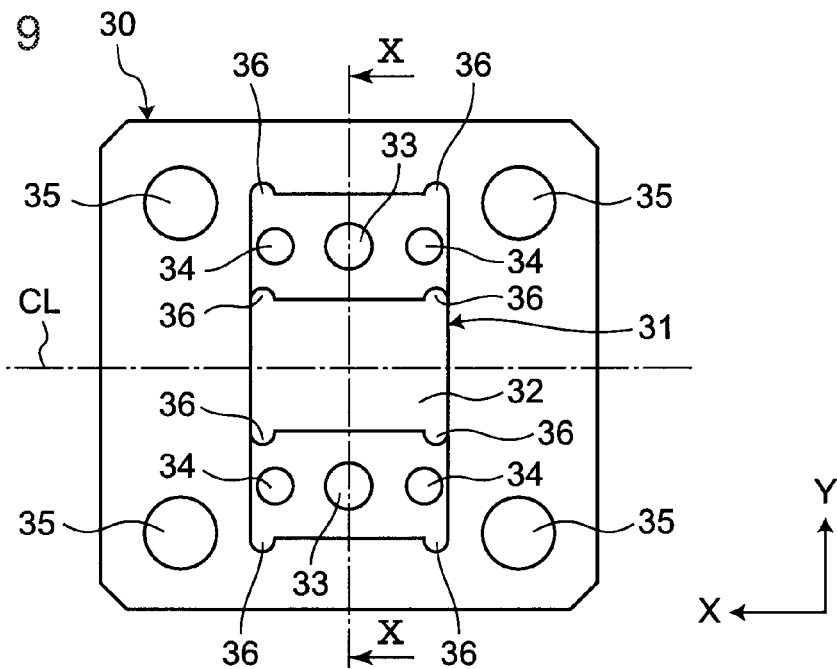
FIG. 9 is a rear view of the base housing of the socket of FIG. 1.
Figure 10:
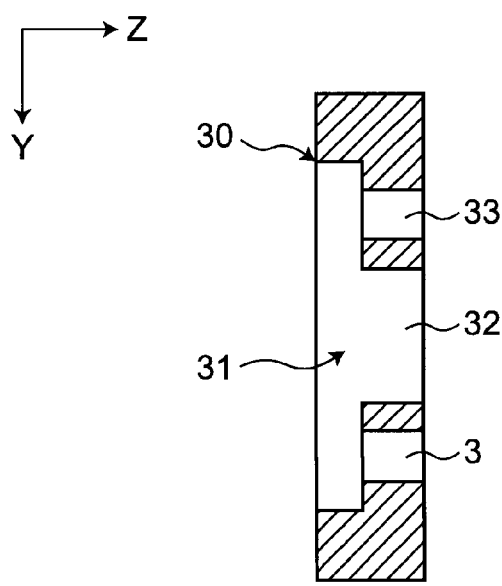
FIG. 10 is a sectional view taken along line X-X of FIG. 9.

The base housing 30 is provided at its center with a holding recessed portion 31. As illustrated in FIGS. 9 and 10, the holding recessed portion 31 has a substantially rectangular shape in plan view seen from the Z direction, and is disposed such that its longitudinal direction is the Y direction.

The holding recessed portion 31 is provided at its center with an opening 32 passing through the base housing 30 in the Z direction. The opening 32 is provided such that when the pair of housings 10 and 10 is held by the base housing 30, the high step portion 11 of each housing 10 is positioned in the opening 32.

Semicircular cutouts 36 are provided at respective ends in the X direction of respective side surfaces along the X direction of the holding recessed portion 31 and the opening 32 in plan view seen from the Z direction. Each of the cutouts 36 allows a tool used for attaching and detaching the housing 10 to be inserted thereinto to facilitate attaching and detaching of the pair of housings 10 and 10 to and from the holding recessed portion 31.

A holding hole 33 and positioning holes 34 are provided on each side in the Y direction across the opening 32 of the holding recessed portion 31 so as to be spaced apart in the Y direction and spaced apart along the X direction. The holding hole 33 is disposed at the center in the X direction, and the positioning holes 34 are disposed on respective sides in the X direction across the holding hole 33.

The holding hole 33 has a circular shape in plan view seen from the Z direction, and passes through in the Z direction. The holding hole 33 has the same diameter as the diameter R1 at the upper end in the Z direction of the holding hole 13 of the housing 10, and is provided so as to be coaxial with the holding hole 13 of the housing 10 when the housing 10 is positioned in the base housing 30. The base housing 30 holds the housing 10 with a fastening member such as a screw through the holding hole 33 and the holding hole 13 of the housing 10.

The positioning hole 34 has a circular shape in plan view seen from the Z direction, and passes through in the Z direction. The positioning hole 34 has the same diameter as the positioning hole 14 of the housing 10, and is provided so as to be coaxial with the positioning hole 14 of the housing 10 when the housing 10 is positioned in the base housing 30. When a positioning pin 40 (refer to FIG. 11) described later is inserted into the positioning hole 34 and the positioning hole 14 of the housing 10, the housing 10 is positioned in the base housing 30.

The base housing 30 is provided at its corners in plan view seen from the Z direction with respective through holes 35 as base positioning portions which positions the base housing 30 with respect to a substrate 90 of an inspection object or an inspection apparatus. Through the four through holes 35, the base housing 30 is positioned on the substrate 90.

Subsequently, a method for assembling the inspection unit 100 using the socket 1 will be described with reference to FIGS. 11 to 14.

Figure 11:
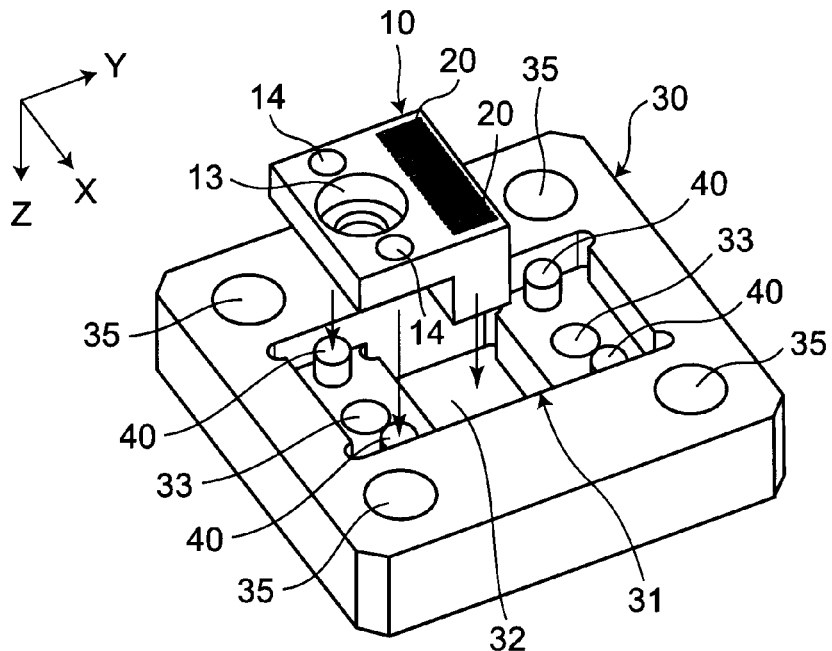
FIG. 11 is a view for illustrating an assembly process of the socket of FIG. 1.

First, as illustrated in FIG. 11, one end of the positioning pin 40 is inserted into each of the positioning holes 34 of the base housing 30, and the other end thereof is allowed to project into the holding recessed portion 31. Then, while a surface with the slot 22 of the high step portion 11 opened is opposed to the opening 32 to allow each of the positioning holes 14 to face the positioning pin 40, the pair of housings 10 and 10 are sequentially housed in the holding recessed portion 31.

At this time, the housing 10 is temporarily fixed to the base housing 30 by being positioned with the positioning pins 40 through the positioning holes 14 of the housing 10 and the positioning holes 34 of the base housing 30. That is, the pair of housings 10 and 10 are positioned independently of each other by the base housing 30 such that not only the housing recessed portion 20 of one of the housings and the housing recessed portion 20 of the other of housings are adjacent to each other so as to be paired, but also array directions of the housing recessed portions 20 of the pair of housings 10 and 10 are parallel (including substantially parallel) to each other.

When the pair of housings 10 and 10 is housed in the holding recessed portion 31, positioning of the pair of housings 10 and 10 with respect to the base housing 30 is adjusted. As illustrated in FIG. 2, there are slight gaps 17 and 37 between each of the positioning hole 14 of the housing 10 and the corresponding one of the positioning pins 40, and between each of the positioning holes 34 of the base housing 30 and the corresponding one of the positioning pins 40, respectively, in a state where the positioning pins 40 are inserted. The gaps 17 and 37 enable the pair of housings 10 and 10, and the base housing 30 to be independently displaced to adjust positioning of the pair of housings 10 and 10 with respect to the base housing 30.

Even in a case of providing any one of the gap 17 between the positioning hole 14 of the housing 10 and the positioning pin 40, and the gap 37 between the positioning hole 34 of the base housing 30 and the positioning pin 40, the pair of housings 10 and 10 can be positioned and adjusted with respect to the base housing 30.

Figure 12:
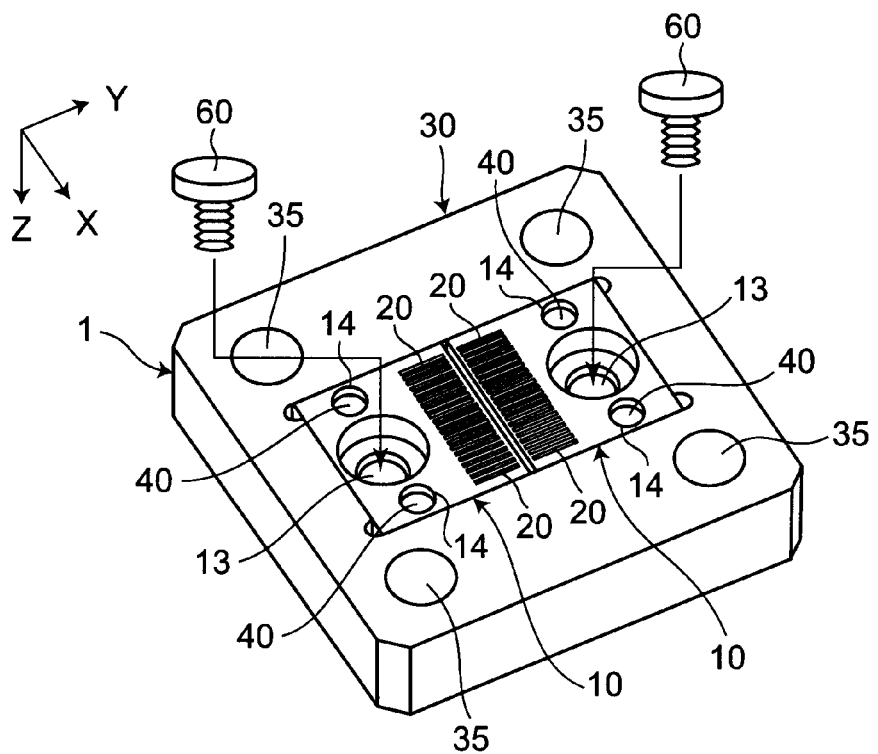
FIG. 12 is a view for illustrating an assembling process of the socket of FIG. 1, following FIG. 11.

When adjustment of positioning of the pair of housings 10 and 10 with respect to the base housing 30 is completed, the pair of housings 10 and 10 is fixed to the base housing 30 in a positioned state where the pair of housings 10 and 10 is adjusted in position with respect to the base housing 30 to complete assembly of the socket 1, as illustrated in FIG. 12. The pair of housings 10 and 10, and the base housing 30 are fixed to each other with a fastening member 60 such as a screw through the holding hole 13 of the housing 10 and the holding hole 33 of the base housing 30.

When the pair of housings 10 and 10 is housed in the holding recessed portion 31, the pair of housings 10 and 10 is fixed. to the base housing 30 to complete assembly of the socket 1, as illustrated in FIG. 12. The pair of housings 10 and 10, and the base housing 30 are fixed to each other with a fastening member 60 such as a screw through the holding hole 13 of the housing 10 and. the holding hole 33 of the base housing 30.

As illustrated in FIG. 2, both surfaces in a height direction (Z direction) of the socket 1 are each in a flat state without a step between the pair of housings 10 and 10, and the base housing 30.

Figure 13:
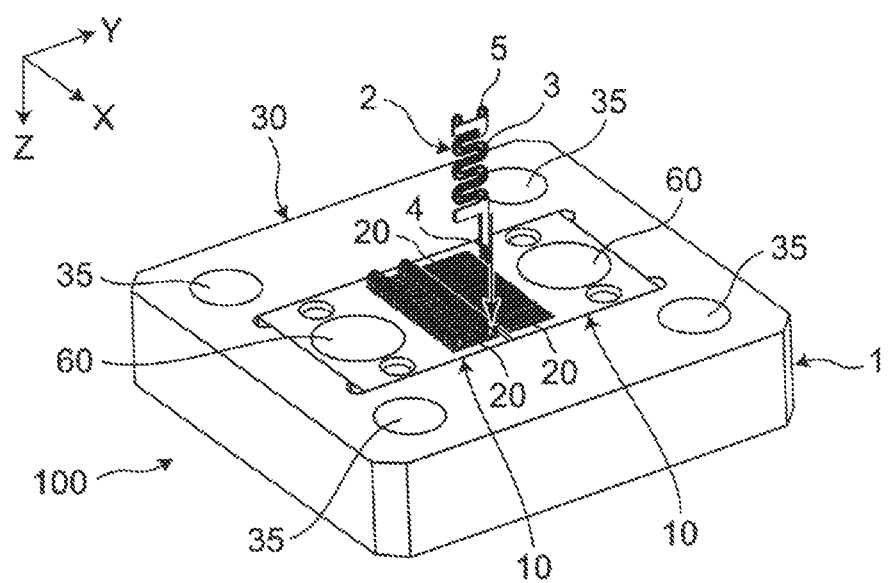
FIG. 13 is a view for illustrating an assembling process of the socket of FIG. 1, following FIG. 12.

When assembly of the socket 1 is completed, the probe pin 2 is inserted into the housing recessed portion 20 from its first contact portion 4, and then the probe pins 2 are housed in all necessary housing recessed portions 20 to complete assembly of the inspection unit 100, as illustrated in FIG. 13.

Figure 14:
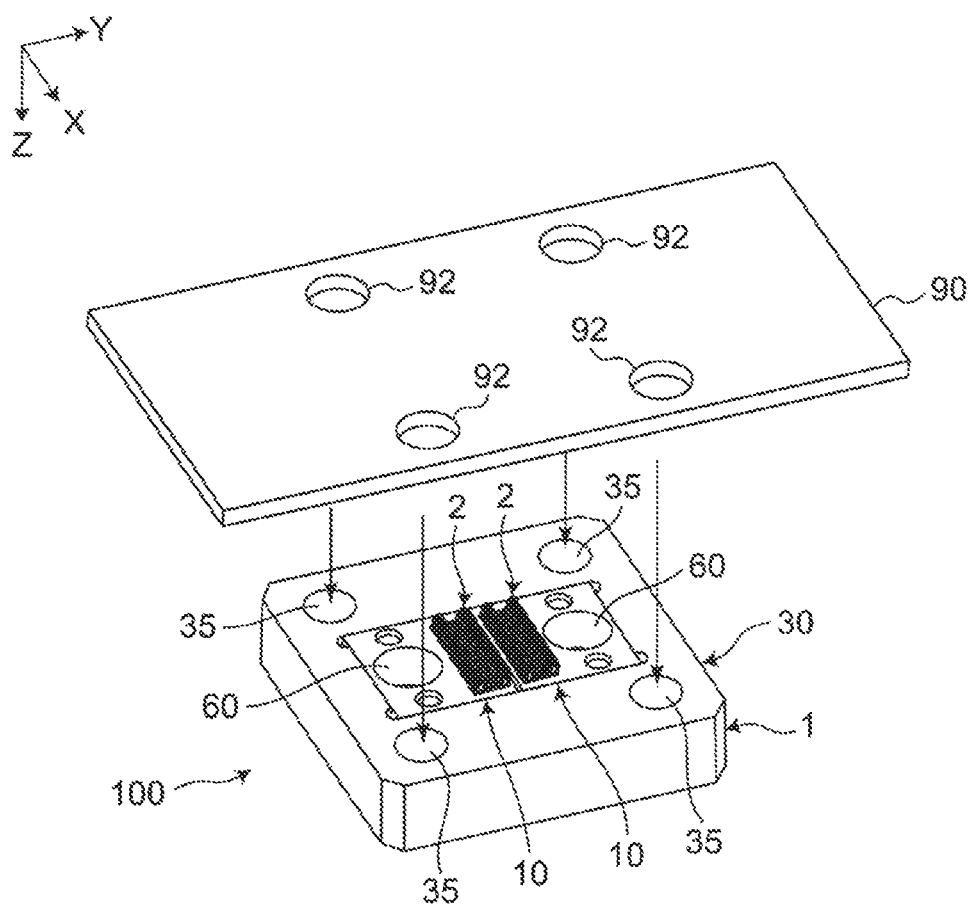
FIG. 14 is a view for illustrating an assembling process of the socket of FIG. 1, following FIG. 13.

As illustrated in FIG. 2, the assembled inspection unit 100 is positioned with respect to a substrate 90 of an inspection object or an inspect apparatus such that the second contact portion 5 of the probe pin 2 is brought into contact with a terminal 91 of the substrate 90. As illustrated in FIG. 14, positioning between the inspection unit 100 and an inspection apparatus or an inspection object is performed with the four through holes 35 of the inspection unit 100 and the four positioning holes 92 provided in the substrate 90.

As described above, in the socket 1 of the first embodiment, the paired housing recessed portions 20 each capable of housing and holding the probe pins 2 are disposed separately in the pair of respective housings 10 and 10 (i.e., each of the first housing and the second housing), and the pair of housings 10 and 10 is positioned independently of each other with respect to the base housing 30. Thus, even when there is an error in processing of a terminal of an inspection apparatus or an inspection object, the probe pin 2 can be accurately positioned by only adjusting positioning of the respective housings 10 and 10 with respect to the base housing 30 to align the probe pin 2 with the terminal of the inspection apparatus or the inspection object.

In addition, the pair of housings 10 and 10 is independently positioned and held integrally by one base housing 30, so that the socket 1 including the pair of housings 10 and 10 can be easily attached to a substrate 90 of an inspection object or an inspection apparatus while the pair of housings 10 and 10 is positioned with high accuracy.

Each of the housings 10 is configured such that a plurality of housing recessed portions 20 is disposed at intervals so as to form a row. This enables to deal with various aspects of a terminal of an inspection apparatus or an inspection object.

The base housing 30 is provided with the through hole 35, so that the base housing 30 can be accurately positioned with respect to an inspection apparatus or an inspection object.

Figure 15:
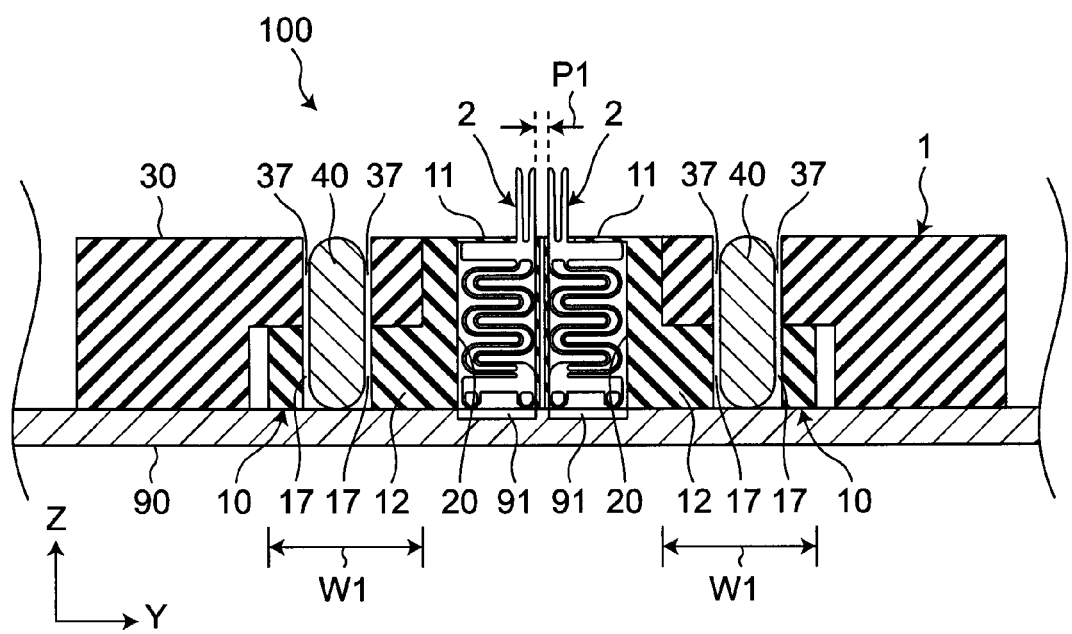
FIG. 15 is a sectional view for illustrating another example of the socket of FIG. 1.
Figure 16:
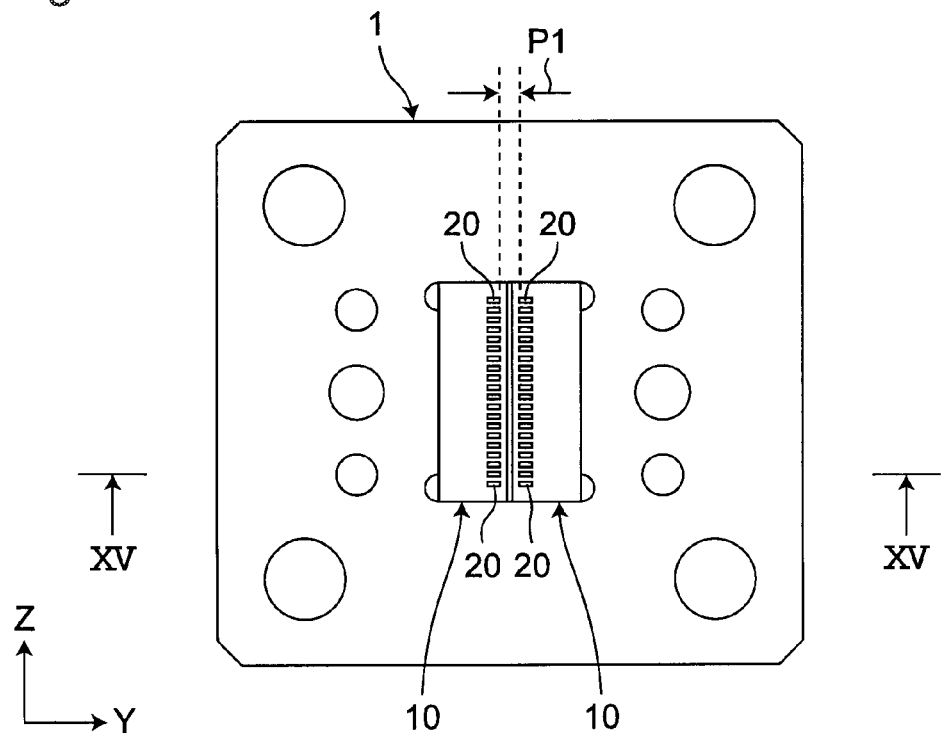
FIG. 16 is a plan view of the socket of FIG. 15.
Figure 17:
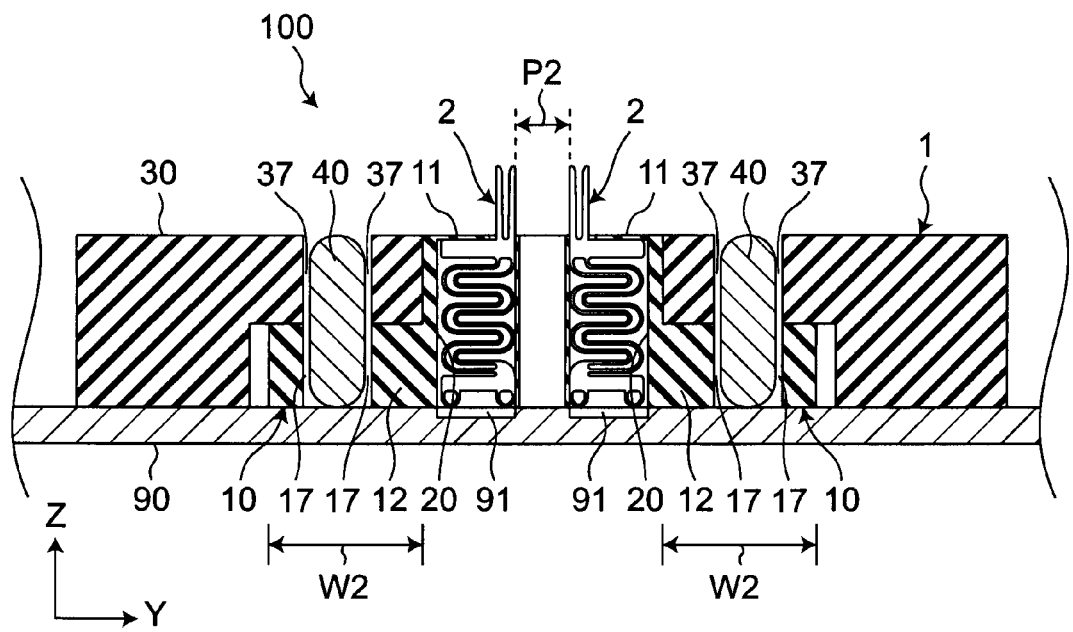
FIG. 17 is a sectional view for illustrating another example of the socket of FIG. 1, following FIG. 15.
Figure 18:
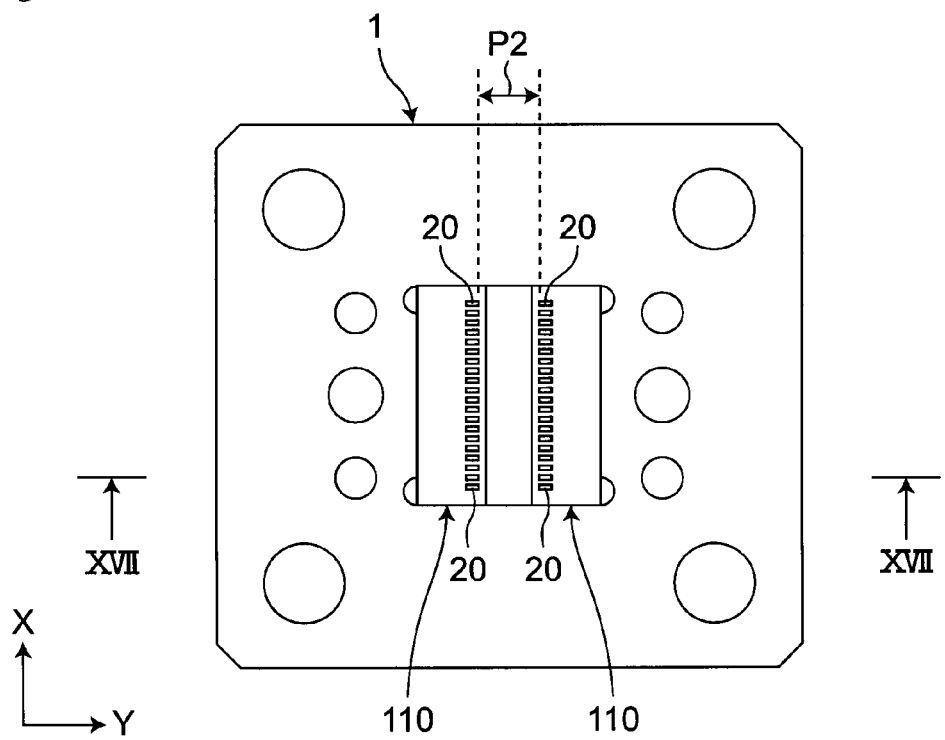
FIG. 18 is a plan view of the socket of FIG. 17.

In the socket 1 of the first embodiment, the base housing 30 can position and hold a plurality of pairs of housings 10 and 10 different in length W in the Y direction of the low step portion 12. As illustrated in FIGS. 15 and 16, when a housing 10 provided with a low step portion 12 having a length W1 in the Y direction is used, for example, a pitch (in the Y direction) of the paired probe pins 2 can be set to a narrow pitch P1. In addition, as illustrated in FIGS. 17 and 18, when a housing 10 provided with a low step portion 12 having a length W2 in the Y direction is used, a pitch (in the Y direction) of the paired probe pins 2 can be set to a pitch P2 wider than the pitch P1 in FIGS. 15 and 16. That is, the socket 1 is applicable to various aspects of a terminal of an inspection apparatus or an inspection object by only changing shape (particularly a length dimension) of the housing 10.

When shape of the first and second contact portions 4 and 5 of the probe pin 2 is changed in addition to the shape of the housing 10, it is possible to widen a range of applicable aspects of a terminal of an inspection apparatus or an inspection object. This enables the base housing 30 to be generalized, so that productivity of the socket 1 and the inspection unit 100 can be improved.

(Second Embodiment)

Figure 19:
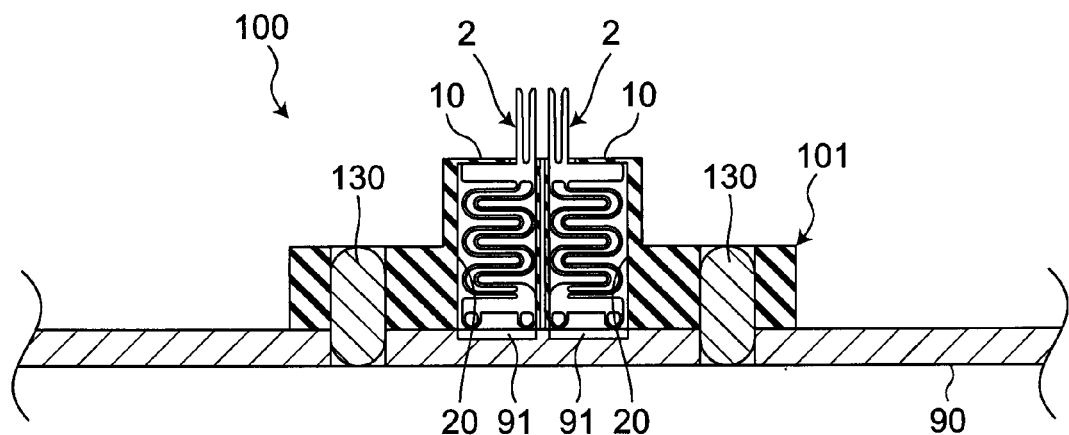
FIG. 19 is a sectional view illustrating a state where an inspection unit using a socket according to a second embodiment of the present invention is attached to an inspection apparatus or a substrate of an inspection object.

As illustrated in FIG. 19, a socket 101 of a second embodiment is different from the socket 1 of the first embodiment in that a substrate attachment pin 130 is used as another example of the positioning member to directly attach a pair of housings 10 and 10 to a substrate 90 of an inspection object or an inspection apparatus while positioning the pair of housings 10 and 10.

In the second embodiment, the same reference numerals are assigned to the same parts as those in the first embodiment to eliminate description thereof, and differences from the first embodiment will be described.

As the substrate attachment pin 130, any fastening member, which can position and hold the pair of housings 10 and 10 with respect to a substrate 90, can be used. That is, another example of the positioning member may be configured to be able to position the pair of housings 10 and 10 independently of each other such that the housing recessed portion 20 of one of the pair of housings 10 and 10, and the housing recessed portion 20 of the other thereof, are disposed adjacent to each other so as to be paired, as well as array directions of the respective housing recessed portions 20 are parallel to each other.

(Third Embodiment)

Figure 20:
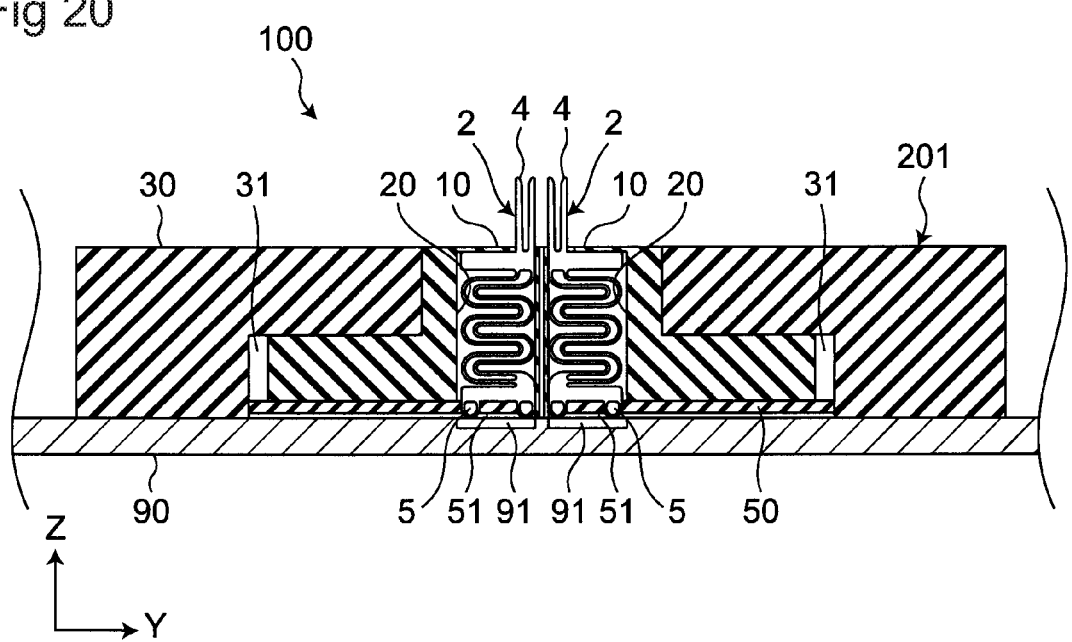
FIG. 20 is a sectional view illustrating a state where an inspection unit using a socket according to a third embodiment of the present invention is attached to an inspection apparatus or a substrate of an inspection object.

As illustrated in FIG. 20, a socket 201 of a third embodiment is different from the socket 1 of the first embodiment in including an insulating lid 50 which can cover each of housing recessed portions 20 of a pair of housings 10 and 10, and hold each probe pin 2 in each of the housing recessed portions 20.

In the third embodiment, the same reference numerals are assigned to the same parts as those in the first embodiment to eliminate description thereof, and differences from the first embodiment will be described.

The lid 50 is provided so as to cover a holding recessed portion 31 of a base housing 30 and to cover the plurality of housing recessed portions 20 of each housing 10. The lid 50 is provided with a hole 51 for exposing a second contact portion 5 of the probe pin 2 to the outside of the housing 10.

When the lid 50 is provided to cover the housing recessed portion 20 of each housing 10 as described above, it is possible to prevent the probe pin 2 from coming out of the housing recessed portion 20.

While various embodiments of the present invention have been described in detail with reference to the drawings, finally, various aspects of the present invention will be described.

A socket according to a first aspect of the present invention includes: a pair of housings each including a housing recessed portion capable of housing and holding a contact provided at its one end with a first contact portion and at its the other end with a second contact portion while the first and second contact portions each are exposed; and a positioning member which positions the pair of housings independently of each other such that the housing recessed portion of one of the pair of housings and the housing recessed portion of the other of the pair of housings are disposed adjacent to each other to be paired.

According to the socket of the first aspect, the paired housing recessed portions each capable of housing and holding a contact are separately disposed in the pair of respective housings and the pair of housings is positioned independently from each other by the positioning member, so that even when there is an error in processing of a terminal of an inspection apparatus or an inspection object, for example, a contact can be accurately positioned to align with the terminal of the inspection apparatus or the inspection object.

In a socket according to a second aspect of the present invention, the positioning member is a base housing including one holding recessed portion which positions the pair of housings independently of each other, and holds the pair of housings integrally with each other.

According to the socket of the second aspect, the pair of housings is independently positioned and held integrally by one base housing, so that the socket including the pair of housings can be easily attached to a substrate 90 of an inspection object or an inspection apparatus while the pair of housings is positioned with high accuracy.

In a socket according to a third aspect of the present invention, the socket further includes a first pair of housings serving as the pair of housings, and a second pair of housings that is different from the pair of housings in a distance between the paired housing recessed portions and that can be positioned and held in the one holding recessed portion of the base housing in which the first pair of housings is positioned and held, wherein one of the pairs of housings selected between the first pair of housings and the second pair of housings is positioned and held in the one holding recessed portion of the base housing.

According to the socket of the third aspect, the socket is applicable to various aspects of a terminal of an inspection object or an inspection apparatus.

In a socket according to a fourth aspect of the present invention, the base housing includes a base positioning portion for positioning the contact held in the housing recessed portion of each of the housings with respect to a terminal of an inspection apparatus or a substrate of an inspection object.

According to the socket of the fourth aspect, it is possible to accurately position the contact held in the housing recessed portion of each of the housings with respect to a terminal of an inspection apparatus or an inspection object.

In a socket according to a fifth aspect of the present invention, the socket further includes a lid which covers the housing recessed portion and holds the contact in the housing recessed portion.

According to the socket of the fifth aspect, it is possible to prevent the contact from coming out of the housing recessed portion.

A socket according to a sixth aspect of the present invention, each of the pair of housings includes a plurality of the housing recessed portions spaced apart, and the plurality of the housing recessed portions is disposed such that array directions of the respective housing recessed portions are parallel to each other.

According to the socket of the sixth aspect, the socket is applicable to various aspects of an a terminal of an inspection apparatus or an inspection object.

When any embodiments or modifications of the various embodiments or modifications are suitably combined with each other, it is possible to achieve respective effects possessed by them. In addition, combinations of embodiments themselves or examples themselves, or combinations of embodiments and examples, are possible, and combinations of features in different embodiments or examples are also possible.

While the present invention is fully described in association with the preferred embodiments with reference to the accompanying drawings, various variations and modifications are obvious to those skilled in the art. Such variations and modifications should be understood to be included in the scope of the present invention according to the appended claims unless without departing from the scope thereof.

INDUSTRIAL APPLICABILITY

The socket of the present invention can be applied to an inspection unit used for inspecting a liquid crystal panel, for example.

REFERENCE SIGNS LIST 1, 101, 201. socket
2. probe pin
3. elastic portion
4. first contact portion
5. second contact portion
10. housing
11. high step portion
12. low step portion
13. holding hole portion
14. positioning hole
15. flange portion
17. gap
20. housing recessed portion
21. opening
22. slot
30. base housing
31. holding recessed portion
32. opening
33. holding hole portion
34. positioning hole
35. through hole
36. cutout
37. gap
40. positioning pin
50. lid
51. hole
60. fastening member
90. substrate
91. terminal
92. positioning hole
100. inspection unit
130. substrate attachment pin
R1, R2. diameter of opening of holding hole 13
CL. center line of base housing 30
P1, P2. pitch between pair of probe pins 2
W, W1, W2. length of low step portion 12

The invention claimed is:

1. A socket comprising:
a first housing and a second housing each comprising a housing recessed portion capable of housing and holding a contact having a plate shape and provided with a first contact portion at a first end of the contact, and with a second contact portion at a second end of the contact, the first and second contact portions each being exposed; and
a positioning member that positions the first and second housings independently of each other such that the housing recessed portion of the first housing and the housing recessed portion of the second housing are disposed adjacent to each other to be paired in a direction intersecting a plate thickness direction of the contact, wherein
the positioning member comprises a base housing comprising one holding recessed portion positioning the first and second housings independently of each other and holding the first and second housings integrally with each other, and
the one holding recessed portion, that positions and holds a first pair of housings serving as the first and second housings, is configured to be capable of positioning and holding a second pair of housings, an interval of the second pair of housings between the recessed portions to be paired being different from the interval of the first pair of housings.

2. The socket according to claim 1, wherein
each of the first and second housings comprises a plurality of the housing recessed portions spaced apart, and
the plurality of the housing recessed portions is disposed such that array directions of the respective housing recessed portions are parallel to each other.

3. The socket according to claim 1,
wherein one of the first pair of housings and the second pair of housings is positioned and held in the one holding recessed portions of the base housing.

4. The socket according to claim 1, wherein the base housing comprises a base positioning portion for positioning the contact held in the housing recessed portion of each of the housings with respect to a terminal of an inspection apparatus or a substrate of an inspection object.

5. The socket according to claim 1, further comprising
a lid that covers the housing recessed portion and holds the contact in the housing recessed portion.

6. A socket comprising:
a first housing and a second housing each comprising a plurality of housing recessed portions capable of housing and holding a contact provided with a first contact portion at a first end of the contact and with a second contact portion at a first end of the contact while the first and second contact portions each are exposed; and
a positioning member positioning the first and second housings independently of each other such that the housing recessed portion of the first housing and the housing recessed portion of the second housing are disposed adjacent to each other to be paired in a direction intersecting an array direction of the plurality of housing recessed portions, wherein
the positioning member comprises a base housing comprising one holding recessed portion positioning the first and second housings independently of each other and holding the first and second housings integrally with each other, and
the one holding recessed portion that positions and holds a first pair of housings serving as the first and second housings, is configured to be capable of positioning and holding a second pair of housings, an interval of the second pair of housings between the recessed portions to be paired being different from the interval of the first pair of housings.

7. The socket according to claim 6, wherein
each of the first and second housings comprises a plurality of the housing recessed portions spaced apart, and
the plurality of the housing recessed portions is disposed such that array directions of the respective housing recessed portions are parallel to each other.

8. The socket according to claim 6, wherein one of the first pair of housings and the second pair of housings is positioned and held in the one holding recessed portions of the base housing.

9. The socket according to claim 6, wherein the base housing comprises a base positioning portion for positioning the contact held in the housing recessed portion of each of the housings with respect to a terminal of an inspection apparatus or a substrate of an inspection object.

10. The socket according to claim 6, further comprising
a lid covering the housing recessed portion and holds the contact in the housing recessed portion.

* * * * *